US009989817B2

(12) United States Patent
Lin et al.

(10) Patent No.: US 9,989,817 B2
(45) Date of Patent: Jun. 5, 2018

(54) PIXEL STRUCTURE (71) Applicant: AU OPTRONICS CORPORATION, Hsin-chu (TW)

(72) Inventors: Gang-Yi Lin, Hsin-chu (TW); Ya-Ling Hsu, Hsin-chu (TW); Chen-Hsien Liao, Hsin-chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days. days.

(21) Appl. No.: 15/705,621

(22) Filed: Sep. 15, 2017

(65) Prior Publication Data
US 2018/0095333 A1 Apr. 5, 2018

(30) Foreign Application Priority Data

Oct. 4, 2016 (TW) .............................. 105131998 A (51) Int. Cl.
*G02F 1/13* (2006.01)
*H01L 27/12* (2006.01)
*H01L 27/146* (2006.01)
*G02F 1/1343* (2006.01)
*G02F 1/1362* (2006.01)
*G02F 1/1368* (2006.01)
*H01L 27/148* (2006.01)
*G02F 1/1333* (2006.01)

(52) U.S. Cl.
CPC ...... *G02F 1/134327* (2013.01); *G02F 1/1368* (2013.01); *G02F 1/13624* (2013.01); *G02F 1/136286* (2013.01); *H01L 27/124* (2013.01); *H01L 27/14603* (2013.01); *H01L 27/14605* (2013.01); *H01L 27/14812* (2013.01); *G02F 1/133305* (2013.01); *G02F 2001/134345* (2013.01); *G02F 2201/123* (2013.01)

(58) Field of Classification Search
CPC ......... G02F 1/133707; G02F 1/134327; G02F 1/136286; G02F 1/1368; H01L 27/124; H01L 27/14603; H01L 27/14605; H01L 27/14812
See application file for complete search history.

(56) References Cited

U.S. PATENT DOCUMENTS

| 6,933,997 B2 | 8/2005 | Kim |
| 7,295,273 B2 | 11/2007 | Nishikawa et al. |
| 8,040,479 B2 | 10/2011 | Song |
| 2016/0274392 A1* | 9/2016 | Li .......................... H01L 27/124 |

* cited by examiner

*Primary Examiner* — Thanhha Pham
(74) *Attorney, Agent, or Firm* — Tim Tingkang Xia, Esq.; Locke Lord LLP (57) ABSTRACT

A pixel structure includes a scan line, a signal line and a first pixel. The first pixel includes a switch device and a pixel electrode. A gate of the switch device is electrically connected to the scan line. The pixel electrode is electrically connected to the switch device, and the pixel electrode includes a plurality of slits. The signal line includes a first portion and a second portion, the pixel electrode overlaps the first portion of the signal line, and the scan line overlaps the second portion of the signal line. The first portion of the signal line includes at least one bent portion, the bent portion is disposed along the arrangement directions of the slits, and the pixel electrode covers the edges of the bent portion of the signal line.

16 Claims, 11 Drawing Sheets

PIXEL STRUCTURE

CROSS-REFERENCE TO RELATED PATENT APPLICATION

This application claims priority to and the benefit of, pursuant to 35 U.S.C. § 119(a), patent application Serial No. 105131998 filed in Taiwan on Oct. 4, 2016. The disclosure of the above application is incorporated herein in its entirety by reference Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present invention relates to a pixel structure, and in particular, to a pixel structure having a signal line disposed along directions of slits of a pixel electrode.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

In recent years, large-sized curved screen televisions have been developed in response to the increasing demand for displays by users. A large-sized curved screen television provides a viewer with a better viewing angle by means of a fixed curvature, enables the viewer to view a full screen by using a relatively small viewing angle, and provides a visual effect with a preferred depth of field by further processing images. However, a common curved screen display has an upper substrate and a lower substrate with a same size, and a thickness exists between the upper substrate and the lower substrate. Therefore, the upper substrate and the lower substrate cannot be bent by a same curvature, resulting in dislocation of a black matrix for blocking light in the curved screen display as well as light leakage, thereby further causing brightness unevenness of frames. Generally, an extending direction of a data line of a curved screen display is substantially perpendicular to a bending direction of the curved screen display. Therefore, a part of the black matrix parallel to the extending direction of the data line is subjected to severe dislocation. As a result, design of removing the part of black matrix has been developed. A metal shielding layer is used to replace the part of black matrix on an array substrate, and the data line is moved to an opening region, thereby preventing the data line from overlapping the metal shielding layer, and shielding a voltage signal of the data line by means of a pixel electrode. However, a pixel electrode of a common display has a slit, and an extending direction of a data line generally intersects with a direction of the slit. Therefore, an electric field springs out from the slit and affects directions of surrounding liquid crystals, resulting in a crosstalk problem.

SUMMARY

One of the objectives of the present invention is to provide a pixel structure having a signal line disposed along directions of slits of a pixel electrode.

An embodiment of the present invention provides a pixel structure, disposed on a substrate, wherein the pixel structure comprises a scan line, a signal line, and a first pixel. The scan line is disposed on the substrate in a manner of extending along a first direction, and the signal line is disposed on the substrate in a manner of extending along a second direction, the first direction and the second direction intersecting with each other. The first pixel comprises a switch device and a pixel electrode. A gate of the switch device is electrically connected to the scan line. The pixel electrode is electrically connected to the switch device, and the pixel electrode comprises a plurality of slits. The signal line comprises a first portion and a second portion, the first portion of the signal line overlaps the pixel electrode, the second portion of the signal line overlaps the scan line, the first portion of the signal line comprises at least one bent portion, the bent portion of the signal line is disposed along directions of the slits, and the pixel electrode covers edges of the bent portion of the signal line.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION

The present disclosure will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

Figure 1A:
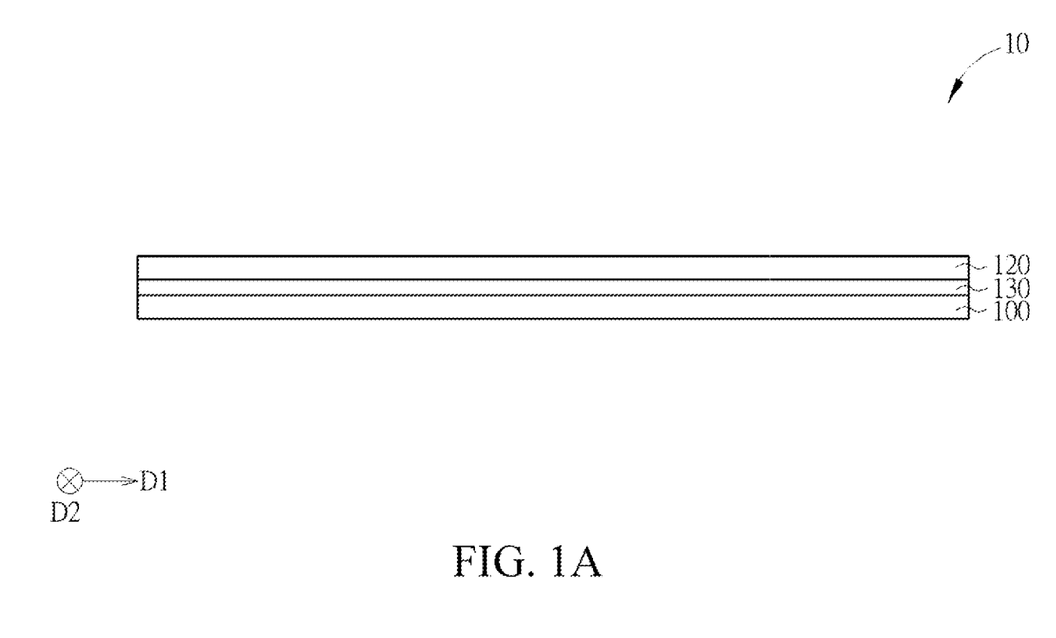
FIG. 1A is a sectional view of a display panel according to an embodiment of the invention.
Figure 1B:
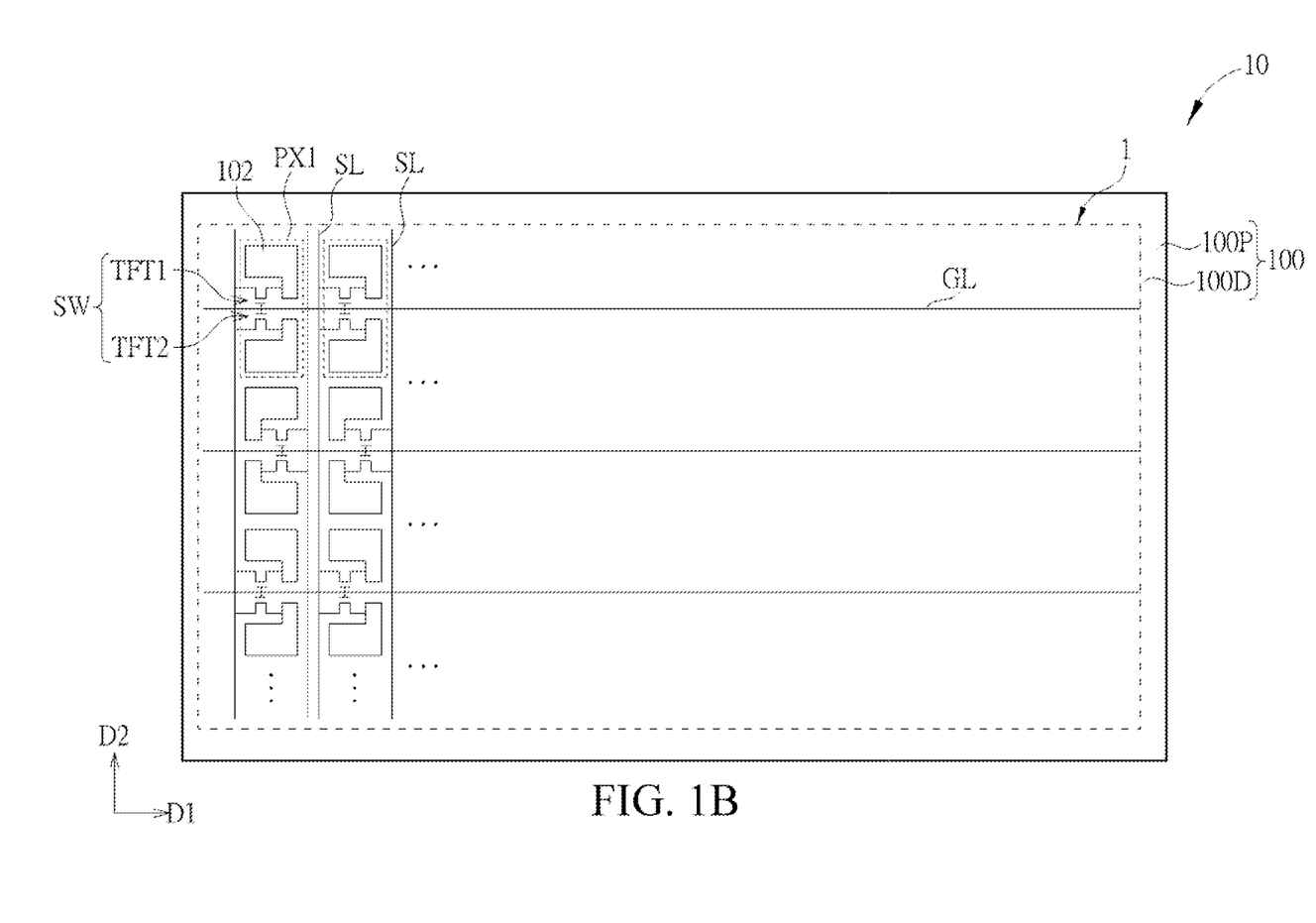
FIG. 1B is a schematic diagram of the display panel and a pixel structure thereof of a first embodiment according to FIG. 1A.
Figure 1C:
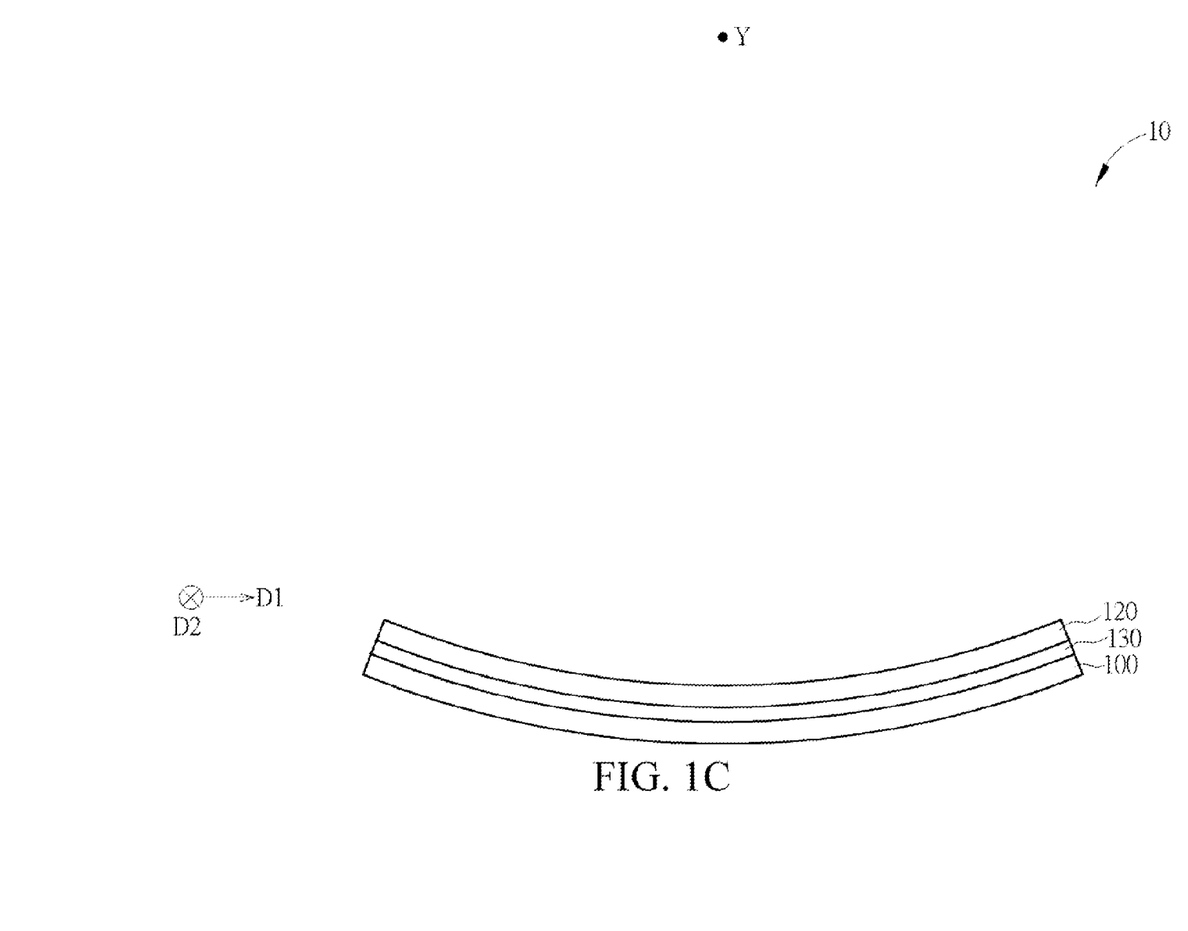
FIG. 1C is a sectional view of a curved screen formed by bending the display panel according to FIG. 1A.
Figure 2:
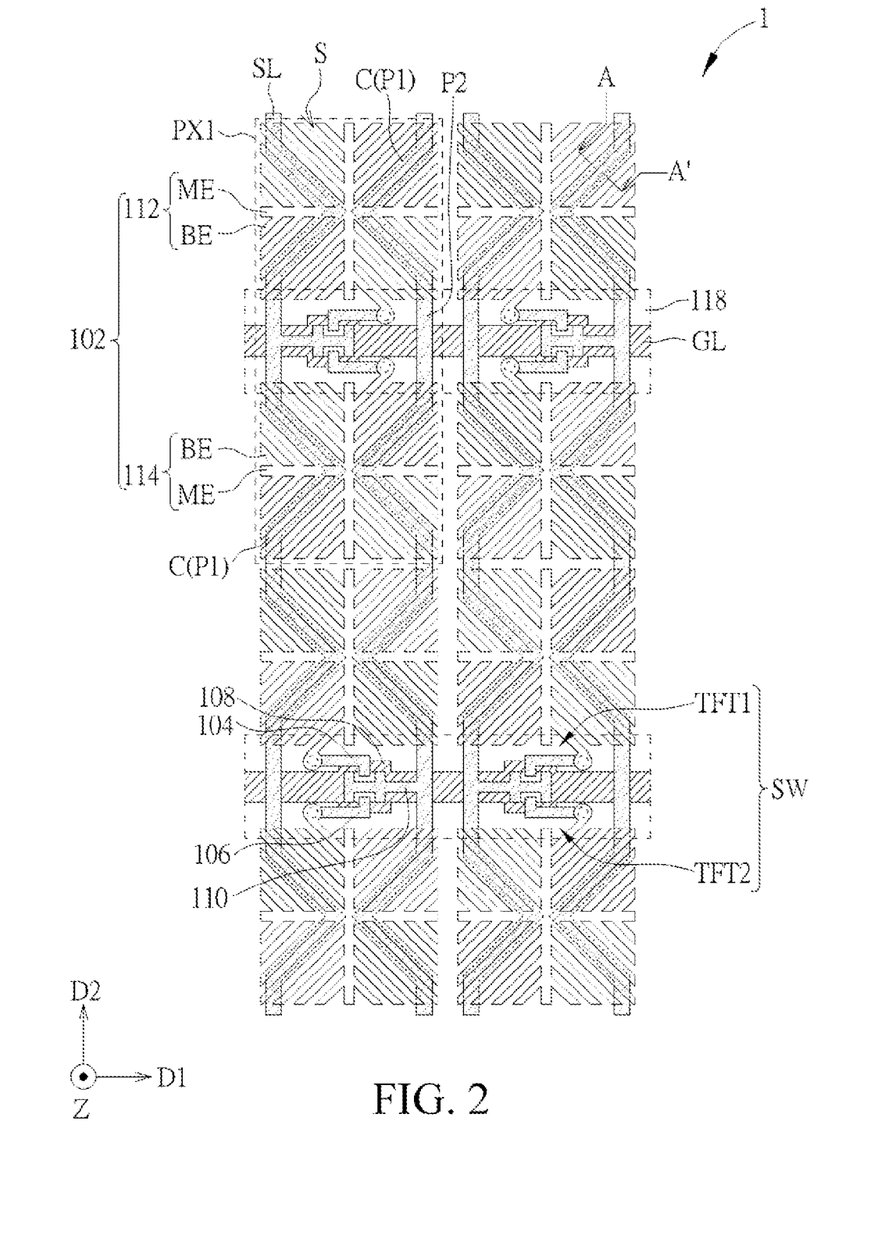
FIG. 2 is a partially enlarged schematic diagram of the pixel structure according to the first embodiment of the invention.
Figure 3:
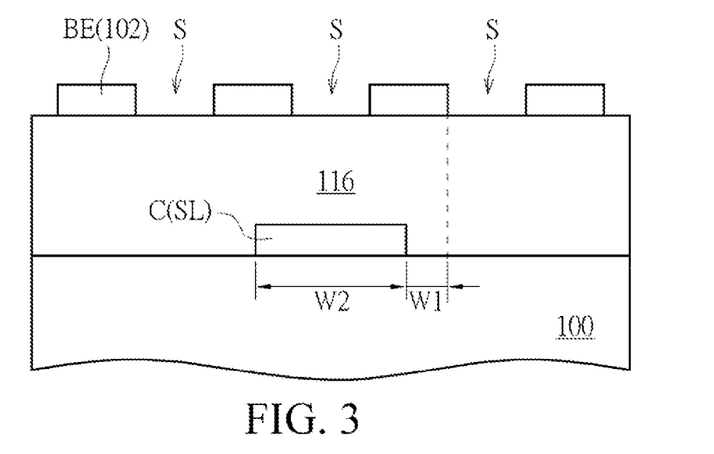
FIG. 3 is a sectional view of the pixel structure taking along line A-A' of FIG. 2.

Referring to FIG. 1A to FIG. 3. FIG. 1A is a sectional view of a display panel according to an embodiment of the invention, FIG. 1B is a schematic diagram of the display panel and a pixel structure thereof of a first embodiment according to FIG. 1A, FIG. 1C is a sectional view of a curved screen formed by bending the display panel according to FIG. 1A, FIG. 2 is a partially enlarged schematic diagram of the pixel structure according to the first embodiment of the invention, and FIG. 3 is a sectional view of the pixel structure taking along line A-A' of FIG. 2. As shown in FIG. 1A and FIG. 1B, this embodiment introduces a display panel 10 that can be used as a curved screen display panel, and when the display panel 10 is not bent, a sectional view of the display panel 10 is as shown in FIG. 1A. The display panel 10 includes a substrate 100, a substrate 120, and a display medium layer 130 disposed between the substrates 100, 120. In this embodiment, a liquid crystal display panel is used as an example of the display panel 10, and the display medium layer 130 is a liquid crystal layer, but the present invention is not limited thereto. Alternatively, the display panel 10 may be another type of flat-screen display panel, or one of various types of display panels that can be manufactured into curved screen panels, for example, an organic light-emitting display panel, but the present invention is not limited thereto. In this embodiment, the substrate 100 is an array substrate, on which an arrayed pixel structure 1 is disposed, and the substrate 120 is an opposite substrate, a surface of which may be provided with a common electrode and a black matrix, but the present invention is not limited thereto. The common electrode and the black matrix may be separately disposed on a surface of the substrate 100. The substrates 100, 120 include flexible substrates or moldable substrates, such as plastic substrates, but the present invention is not limited thereto. Further, the substrate 100 includes a display region 100D and a peripheral region 100P at the periphery of the display region 100D, and the pixel structure 1 is located in the display region 100D. Referring to FIG. 1C, in a case in which the display panel 10 is bent to form a curved screen display panel, the display panel 10 in this embodiment has a curved screen in a first direction D1, the display panel 10 has a display screen that is bent along a bending central axis, for example, along a second direction D2 that is used as the bending central axis Y in this embodiment, but the present invention is not limited thereto. The pixel structure 1 includes a plurality of scan lines GL and a plurality of signal lines SL, the scan lines GL are disposed on the substrate 100 in a manner of extending along the first direction D1, the signal lines SL are disposed on the substrate 100 in a manner of extending along the second direction D2. The first direction D1 and the second direction D2 intersect with each other. Therefore, the scan lines G1 are intersected with the signal lines SL to form a network structure on the substrate 100. The scan lines GL and the signal lines SL may be respectively formed by two different patterned conductive layers, but the present invention is not limited thereto. In this embodiment, the signal lines SL are data lines that are respectively electrically connected to sources of switch devices in the pixels, but the present invention is not limited thereto. The pixel structure 1 includes a plurality of pixels that are arranged in the display region 100D. The plurality of pixels includes at least one first pixel PX1. The first pixel PX1 includes a switch device SW and a pixel electrode 102. The switch device SW is electrically connected to a scan line GL, a signal line SL, and the pixel electrode 102. The switch device SW may be a thin film transistor (TFT), but the present invention is not limited thereto. Besides, for example, in the first pixels PX1 in a same column of the pixel structure 1, the switch devices SW of the first pixels PX1 in odd rows are electrically connected to an adjacent signal line SL at a left side of the switch devices SW, and the switch devices SW of the first pixels PX1 in even rows are electrically connected to another adjacent signal line SL at a right side of the switch devices SW, but the present invention is not limited thereto.

To highlight features of the pixel structure 1 in this embodiment, FIG. 2 merely show the scan lines GL, the signal lines SL, the pixel electrodes 102, and the switch devices SW, where four first pixels PX1 are arranged as a 2*2 array, and FIG. 3 merely shows a bent portion C of a signal line SL, branch electrodes BE of a pixel electrode 102, and a color filter layer 116 disposed on the substrate 100, where other devices and film layers, for example, the switching device SW, on the substrate 100 are omitted, so as to highlight a relative arrangement relationship between the bent portion C of the signal line SL and the branch electrodes BE of the pixel electrode 102. As shown in FIG. 2, each pixel electrode 102 includes main electrodes ME and a plurality of branch electrodes BE. Each main electrode ME extends along the first direction D1 and the second direction D2 to form a cross shape. One end of each of the branch electrodes BE is electrically connected to a main electrode ME, and the other end extends along a direction that is not parallel to the first direction D1 and the second direction D2, so as to form a plurality of alignment regions. In this embodiment, an angle between an extending direction of a branch electrode BE and the first direction D1 may be 45°, 135°, 225°, or 315°, but the present invention is not limited thereto. In addition, a slit S is provided between adjacent branch electrodes BE. An angle is formed between an extending direction of a slit S and the first direction D1. In this embodiment, an angle between an extending direction of a slit S and the first direction may be 45°, 135°, 225°, or 315°, but the present invention is not limited thereto. For example, in each pixel electrode 102 shown in FIG. 2, the branch electrodes BE extend out from the main electrode ME to assume a shape of "x" overlapping "+". However, in another variant embodiment, the branch electrodes BE at different sides of the main electrode ME may be connected to each other to form a rhombus shape. A material of the pixel electrode 102 may be a transparent conductive material, such as indium tin oxide (ITO), indium zinc oxide (IZO), or another appropriate conductive material. In this embodiment, the slits S may be of consistent widths (that is, equal width slit design), and the branch electrodes BE have a same width, but the present invention is not limited thereto.

In another embodiment, the slits S or the branch electrodes BE may have widths that are not completely the same.

Further, each signal line SL includes a first portion P1 and a second portion P2, the first portion P1 overlaps the pixel electrode 102 (overlaps the pixel electrode 102 in a vertical projection direction Z), that is, is disposed at an opening region (also referred to as the light transmitting region) of the pixel electrode 102, and the second portion P2 overlaps a scan line GL (overlaps the scan line GL in the vertical projection direction Z). The first portion P1 of the signal line SL includes at least one bent portion C, the bent portion C is disposed along directions of slits S, and the second portion P2 of the signal line SL has a straight-line pattern, for example. In general, in this embodiment, the signal lines SL extend along the second direction D2, as shown in FIG. 1. In a region in which a pixel electrode 102 is provided, a first portion P1 of a signal line SL is disposed along directions of slits S, and in a region in which a scan line GL is provided or a pixel electrode 102 is not provided, a second portion P2 of the signal line SL extends along a straight line parallel to the second direction D2, but the present invention is not limited thereto. Besides, in this embodiment, a second portion P2 is disposed between two adjacent first portions P1, and two ends of the second portion P2 are respectively connected to the two first portions P1. Besides, as shown in FIG. 2 and FIG. 3, a pixel electrode 102 covers edges of a bent portion C of a signal line SL and protrudes from the edges of the bent portion C, where some of the branch electrodes BE covering the edges of the bent portion C protrude from the edges of the bent portion C by a width W1, the width W1 is about ⅓ to 1 times a width W2 of the bent portion C, that is, the width W1 is about ⅓ of W2 to 1 times of W2. For example, the width W1 by which the branch electrodes BE protrude from the edges of the bent portion C is from about 1 micrometer to about 10 micrometers, and preferably, from 4 micrometers to 8 micrometers, but the present invention is not limited thereto. Besides, in this embodiment, the bent portion C of the signal line SL is provided with two branch electrodes BE that respectively cover edges at a left side and a right side of the bent portion C, and a slit S between the two branch electrodes BE exposes a part of the bent portion C.

Further referring to FIG. 2, in this embodiment, each pixel electrode 102 includes a first sub-pixel electrode 112 and a second sub-pixel electrode 114, each switch device SW includes a first transistor TFT1 and a second transistor TFT2, a first drain 104 of the first transistor TFT1 is electrically connected to the first sub-pixel electrode 112, a second drain 106 of the second transistor TFT2 is electrically connected to the second sub-pixel electrode 114, the first transistor TFT1 and the second transistor TFT2 may have a common gate 108 and a common source 110, the gate 108 is electrically connected to a scan line GL, the source 110 is electrically connected to a signal line SL, and the scan line GL is disposed between the first sub-pixel electrode 112 and the second sub-pixel electrode 114. Each of the first sub-pixel electrode 112 and the second sub-pixel electrode 114 has a main electrode ME and branch electrodes BE, a signal line SL in a region of the first pixel PX1 has two bent portions C that respectively overlap the first sub-pixel electrode 112 and the second sub-pixel electrode 114, and the two bent portions C are electrically connected to each other through a second portion P2 of the signal line SL.

Besides, the pixel structure 1 may further include black matrices 118 (positions indicated by dashed lines in FIG. 2), which may be disposed on the substrate 120 opposite to the substrate 100, for example. Each black matrix 118 is disposed along the first direction D1, and covers a scan line GL and a switch device SW. Therefore, the black matrix 118 merely covers a second portion P2 of a signal line SL, and does not extend along the second direction D2 to cover a first portion P1 of the signal line SL. In this embodiment, the display panel 10 uses an imaginary line along the second direction D2 as a bending axis, and the black matrices 118 do not have portions extending along the second direction D2, thereby preventing dislocation of the black matrices on the opposite substrate and the first pixels PX1 on the substrate 100 caused by bending the display panel 10, and further preventing light leakage. Further, the pixel structure 1 may further include a metal shielding line, disposed between pixel electrodes 102 that are disposed side by side along the first direction D1, so as to prevent crosstalk or light leakage between adjacent pixels.

As shown in FIG. 3, in this embodiment, the pixel structure 1 further includes color filter layers 116, each of which is disposed on the substrate 100 and located between a signal line SL and a pixel electrode 102, but the present invention is not limited thereto. In addition, a switch device SW (not shown in FIG. 3) is disposed between a color filter layer 116 and the substrate 100, in other words, in this embodiment, the substrate 100 may be a lower substrate or an array substrate of the display panel 10, and the color filter layers 116 may be regarded as being disposed on the array substrate (color filter on array, COA). Besides, the pixel structure 1 further selectively includes a metal shielding line (not shown) that is disposed, in a manner of extending along the second direction D2, at an intersection of the color filter layers 116 of different colors or an intersection of pixel electrodes 102 of adjacent pixels, is located between the color filter layers 116 and the substrate 100, and can be used to shield light, thereby further avoiding light leakage caused by alignment abnormality of liquid crystal molecules located at the intersection of the color filter layers 116.

Advantages of the bent portion C of the signal line SL of the pixel structure 1 in the present invention are further described below. In a case in which other conditions are the same, a pixel structure having a signal line with a traditional pattern is provided as a comparative embodiment, that is, in the pixel structure of the comparative embodiment, the signal line merely has a straight-line pattern and does not have a bent portion extending along slits of a pixel electrode. In a vertical crosstalk simulation, a reference frame brightness is a brightness value when a full screen displays a frame with a predetermined gray-scale (for example, a black frame with a minimum gray-scale), a tested frame brightness is defined as: an actual brightness value of a region adjacent, in a vertical direction, to a central region when the central region of the screen displays a frame with a maximum gray-scale and other regions display frames with the predetermined gray-scale. A smaller difference between the reference frame brightness and the tested frame brightness indicates a smaller vertical crosstalk problem. Upon simulation, the brightness difference of the comparative embodiment is 1.63%, and the brightness difference of this embodiment is 0.66%. Therefore, it can be known that because the signal line SL of the pixel structure 1 in this embodiment has the bent portion C and two ends of the bent portion C are covered by the pixel electrodes 102, the vertical crosstalk problem can be significantly alleviated, and the display quality can be substantially improved. According to this embodiment, the pixel electrode 102 of the pixel structure 1 covers the edges of the bent portion C of the signal line SL, so as to use the pixel electrode 102 to shield an electric field of the signal line SL (for example, an electric field between the signal line SL and the common electrode), thereby effectively prohibiting a crosstalk phenomenon. In addition, the signal line SL has the bent portion C extending along the directions of the slits S of the pixel electrode 102, and therefore, the electric field of the signal line SL does not damage an effect of the pixel electrode 102 on alignment of liquid crystal molecules, thereby achieving an effect of effectively inhibiting the crosstalk phenomenon without affecting transmittance.

The pixel structure in the present invention is not limited to the foregoing embodiment. Pixel structures of other variant embodiments and exemplary embodiments of the present invention are sequentially introduced below. In addition, to facilitate the comparison between differences between the embodiments and simplify the description, like elements are denoted with a same reference sign in the following embodiments, the description is mainly made to the differences between the embodiments, and details of the repeated parts are not described herein again.

Figure 4:
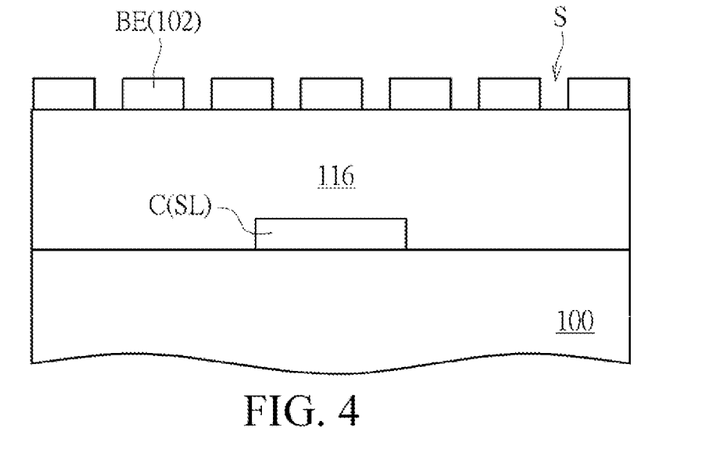
FIG. 4 is a sectional view of a pixel structure according to a first variant embodiment of the first embodiment of the invention.

Referring to FIG. 4, FIG. 4 is a sectional view of a pixel structure according to a first variant embodiment of the first embodiment of the invention. As shown in FIG. 4, this variant embodiment differs from the first embodiment in that: three branch electrodes BE of the pixel electrode 102 are correspondingly disposed above the bent portion C of the signal line SL, where two branch electrodes BE are disposed near the edges of the bent portion C to cover the edges of the bent portion C and protrude from the edges of the bent portion C, and the other branch electrode BE is disposed at a position corresponding to a center of the bent portion C. In this variant embodiment, three branch electrodes BE, as shown in FIG. 4, may be correspondingly disposed above the bent portion C of the signal line SL through adjusting widths of the slits S or widths of the branch electrodes BE.

Figure 5:
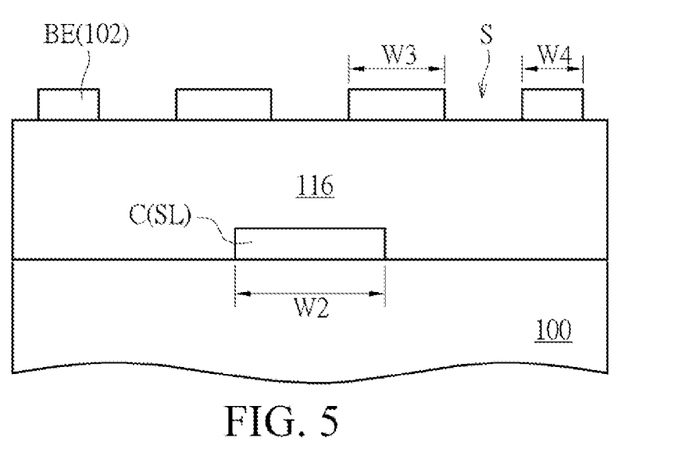
FIG. 5 is a sectional view of a pixel structure according to a second variant embodiment of the first embodiment of the invention.

Referring to FIG. 5, FIG. 5 is a sectional view of a pixel structure according to a second variant embodiment of the first embodiment of the invention. As shown in FIG. 5, this variant embodiment differs from the first embodiment in that: widths W3 of the branch electrodes BE covering the edges of the bent portion C are greater than widths W4 of other branch electrodes BE that do not cover the edges of the bent portion C. In other words, the widths of the branch electrodes BE in this variant embodiment are not completely the same.

Figure 6:
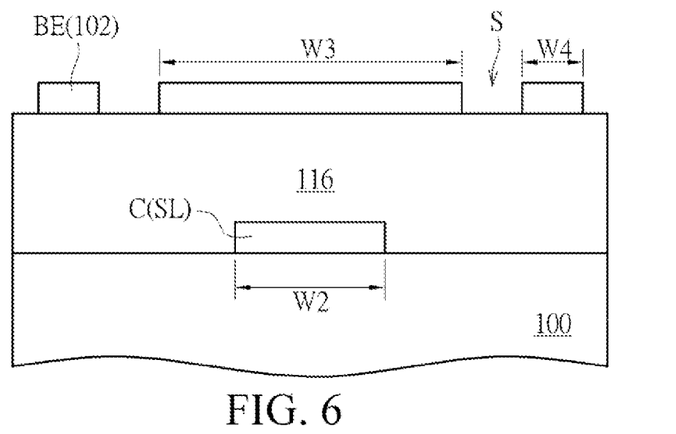
FIG. 6 is a sectional view of a pixel structure according to a third variant embodiment of the first embodiment of the invention.

Referring to FIG. 6, FIG. 6 is a sectional view of a pixel structure according to a third variant embodiment of the first embodiment of the invention. As shown in FIG. 6, this variant embodiment differs from the second variant embodiment in that: only one branch electrode BE is correspondingly disposed above the bent portion C of the signal line SL, a width W3 of the branch electrode BE is greater than the width W2 of the bent portion C of the signal line SL and the widths W4 of other branch electrodes BE, and the branch electrode BE can completely cover the bent portion C and protrude from the two edges of the bent portion C.

Figure 7:
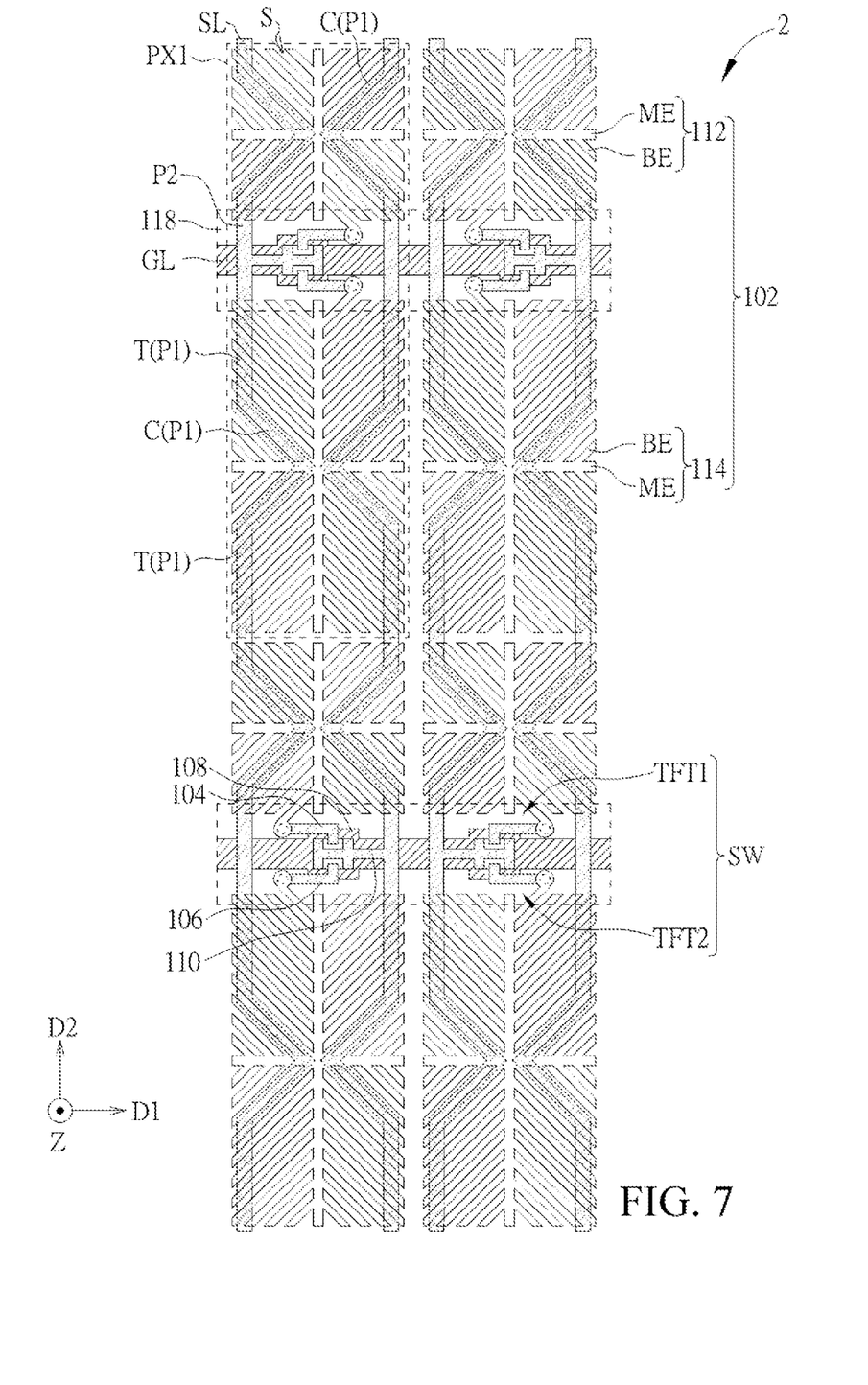
FIG. 7 is a partial schematic diagram of a pixel structure according to a second embodiment of the invention.

Referring to FIG. 7, FIG. 7 is a partial schematic diagram of a pixel structure according to a second embodiment of the invention. As shown in FIG. 7, this embodiment differs from the first embodiment in that: a first portion P1 of a signal line L of a pixel structure 2 further includes a straight-line portion T that overlaps a pixel electrode 102 and is connected to a bent portion C. Specifically, in this embodiment, an area of a second sub-pixel electrode 114 is greater than an area of a first sub-pixel electrode 112, and in a region of the second sub-pixel electrode 114, the signal line SL includes two straight-line portions T extending along a second direction D2, where one straight-line portion T is disposed between a second portion P2 and the bent portion C and is connected to the second portion P2 and the bent portion C, and the other straight-line portion T is disposed between the bent portion C and a bent portion C of another first pixel PX1 there-below and is connected to the two bent portions C. In this embodiment, a region in which the first sub-pixel electrode 112 is disposed may be set as, for example, a primary pixel region and may have a relatively high level, and a region in which the second sub-pixel electrode 114 is disposed may be set as a secondary pixel region and may have a relatively low level, but the present invention is not limited thereto. For another example, in a case in which a frame with a low gray-scale needs to be displayed, merely the region of the first sub-pixel electrode 112 (the primary pixel region) may be driven to display a frame, and the region of the second sub-pixel electrode 114 (the secondary pixel region) is turned off.

Figure 8:
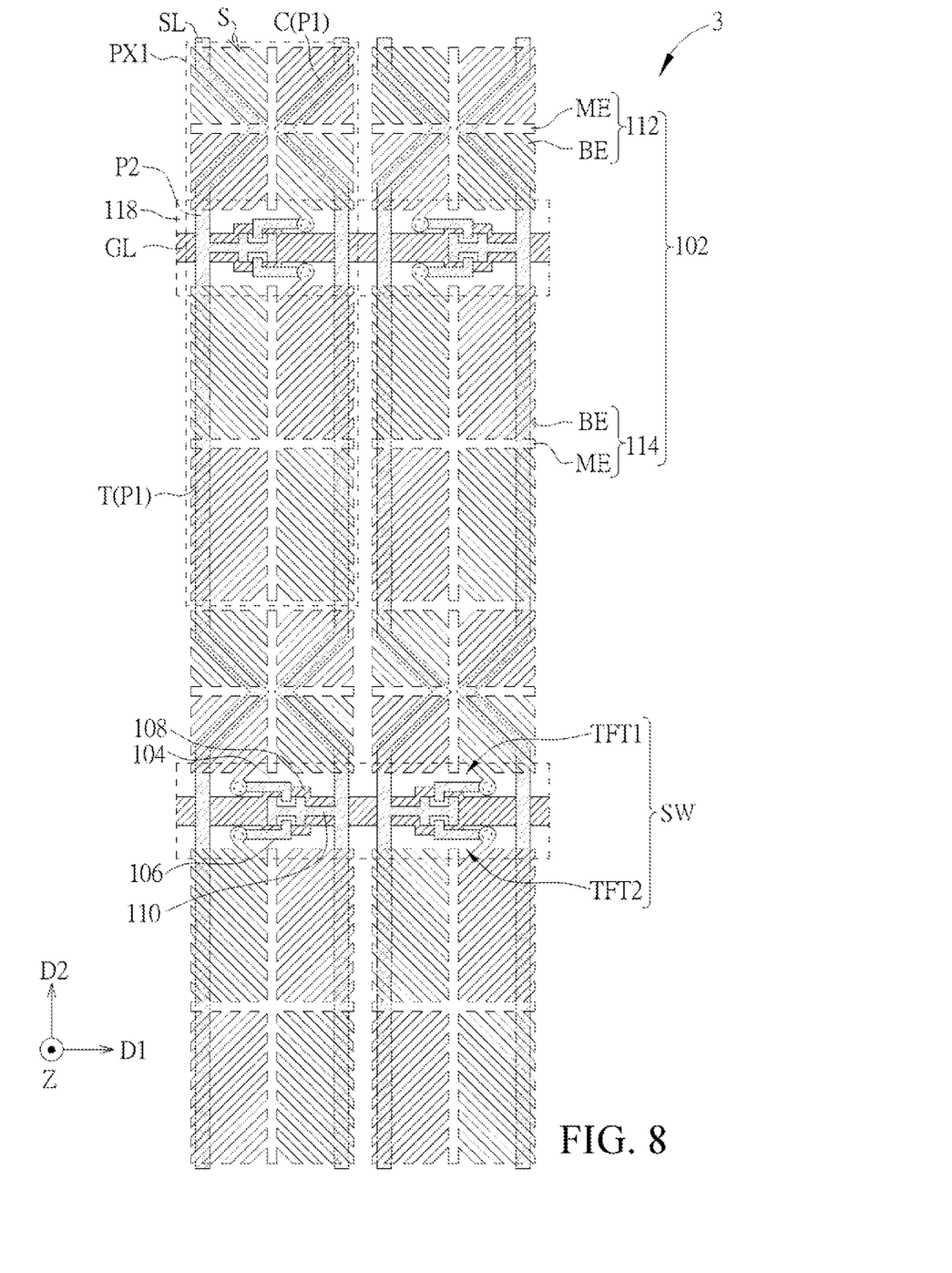
FIG. 8 is a partial schematic diagram of a pixel structure according to a third embodiment of the invention.

Referring to FIG. 8, FIG. 8 is a partial schematic diagram of a pixel structure according to a third embodiment of the invention. As shown in FIG. 8, this embodiment differs from the second embodiment in that: in a region of a second sub-pixel electrode 114 of a pixel structure 3, a signal line SL does not have a bent portion and has a straight-line portion T extending along a second direction D2. The straight-line portion T overlaps the second sub-pixel electrode 114. In this embodiment, one end of the straight-line portion T may be connected to a second portion P2 of the signal line SL, and the other end of the straight-line portion T may be connected to a bent portion C of another adjacent first pixel PX1 in the second direction D2. According to this embodiment, a region in which a first sub-pixel electrode 112 is disposed in a first pixel PX1 is used as a primary display region, and a region in which the second sub-pixel electrode 114 is disposed is used as a secondary display region. When a frame is displayed, a level of the primary display region is greater than that of the secondary display region. A vertical crosstalk problem caused by the springing out of an electric field of the signal line SL is mainly reflected in a low gray-scale frame, and therefore, if it is desired to design the primary display region to display a frame when the display panel 10 displays a low gray-scale frame, it only needs to design a signal line SL to have a bent portion C in the primary display region, so as to alleviate the vertical crosstalk problem, and design the signal line SL to have a straight-line portion T rather than a bent portion C in the secondary display region. In this embodiment, by means of designing the signal line SL to have the bent portion C in the primary display region, and to have the straight-line portion T in the secondary display region, the vertical crosstalk problem can be alleviated, and an impact of a pattern of the bent portion C on light transmittance can be reduced.

Figure 9:
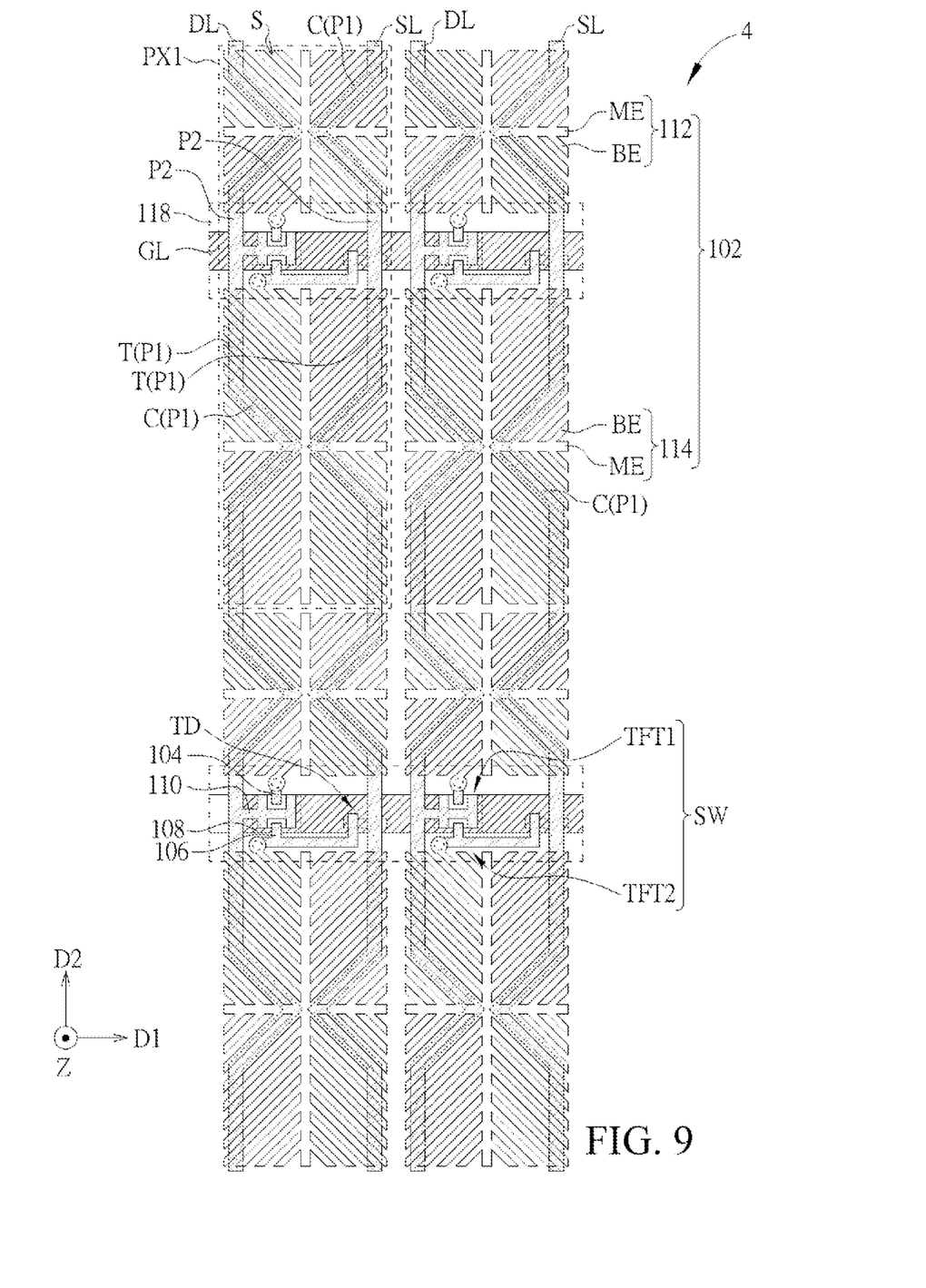
FIG. 9 is a partial schematic diagram of a pixel structure according to a fourth embodiment of the invention.
Figure 10:
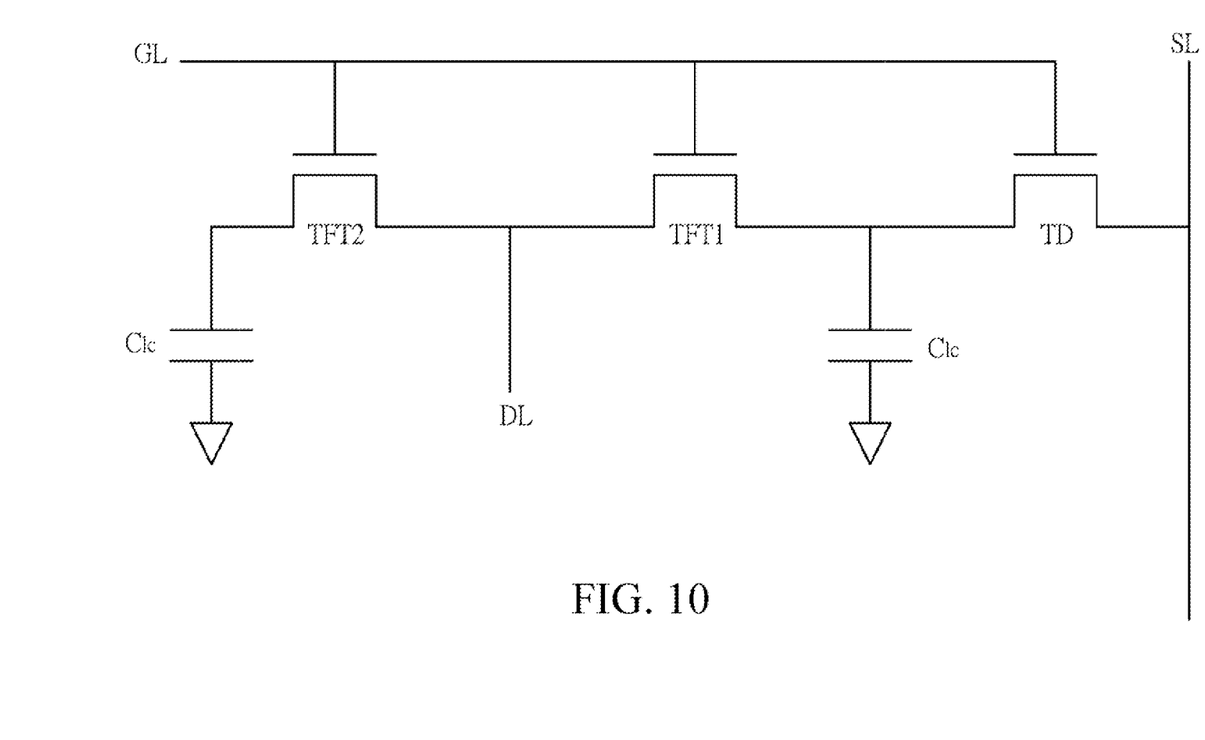
FIG. 10 is a schematic diagram of an equivalent circuit of the first pixel according to FIG. 9.

Referring to FIG. 9 and FIG. 10, FIG. 9 is a partial schematic diagram of a pixel structure according to a fourth embodiment of the invention, and FIG. 10 is a schematic diagram of an equivalent circuit of the first pixel according to FIG. 9. As shown in FIG. 9 and FIG. 10, this embodiment differs from the second embodiment in that: a pixel structure 4 further includes a voltage division device TD, for example, the voltage division device TD is a TFT, the voltage division device TD is electrically connected to a scan line GL, and the voltage division device TD is further electrically connected to a switch device SW. In this embodiment, voltage division devices TD in a same column (a second direction D2) of the pixel structure 4 are all electrically connected to a same signal line SL, but the present invention is not limited thereto. Further, the pixel structure 4 further includes a data line DL that is disposed in a manner of extending along the second direction D2 and electrically connected to a source 110 of a switch device SW. The data line DL may be formed by a patterned conductive layer the same as that of the signal line SL, but the present invention is not limited thereto. In this embodiment, a pattern of the data line DL and a pattern of the signal line SL in a same pixel substantially assume mirror symmetry, each of both including a first portion P1 and a second portion P2, where the first portion P1 overlaps a pixel electrode 102 (overlaps the pixel electrode 102 in a vertical projection direction Z) and is disposed at an opening region (the light transmitting region) of the pixel electrode 102, and the second portion P2 overlaps the scan line GL (overlaps the scan line GL in the vertical projection direction Z). The first portion P1 of the data line DL includes at least one bent portion C that is disposed along directions of slits S, the pixel electrode 102 covers edges of the bent portion C of the data line DL and protrudes from the edges of the bent portion C, and the second portion P2 of the data line DL may have a straight-line pattern, for example, but the present invention is not limited thereto. Besides, switch devices SW in a same column of the pixel structure 4 are all electrically connected to a same data line DL, but the present invention is not limited thereto.

In this embodiment, a switch device SW includes a first transistor TFT1 and a second transistor TFT2, each of the first transistor TFT1 and the second transistor TFT2 includes a first drain 104 and a second drain 106, and the first transistor TFT1 and the second transistor TFT2 share a gate 108 and a source 110. The first drain 104 of the first transistor TFT1 is electrically connected to a first sub-pixel electrode 112, the second drain 106 of the second transistor TFT2 is electrically connected to a second sub-pixel electrode 114, and the voltage division device TD is electrically connected to the second drain 106 of the second transistor TFT2. On the other hand, the first drain 104 of the first transistor TFT1 is electrically connected to the first sub-pixel electrode 112, so as to drive the first sub-pixel electrode 112 through the first drain 104, where the first sub-pixel electrode 112, and a common electrode and a liquid crystal layer (not shown) form a liquid crystal capacitor C1c. Likewise, the second drain 106 of the second transistor TFT2 is electrically connected to the second sub-pixel electrode 114, and the second sub-pixel electrode 114, the common electrode, and the liquid crystal layer also form another liquid crystal capacitor C1c. In this embodiment, the voltage division device TD has a function of allocating and adjusting a voltage. When a signal line SL connected to the voltage division device TD transmits a signal of a high voltage, a relatively stronger electric field of the signal line SL enables sub-pixel electrodes 112 and 114 to have different voltages, thereby affecting directions of tilt angles and arrangement of liquid crystal molecules corresponding to the sub-pixel electrodes 112 and 114. In this embodiment, the pixel electrode 102 is used to cover the edges of the signal line SL, so as to shield the electric field of the signal line SL, thereby reducing an impact of the signal line SL on the arrangement of the liquid crystal molecules. In addition, the signal line SL has a bent portion C extending along directions of slit S of the pixel electrode 102, and therefore, the electric field of the signal line SL does not damage an effect of the pixel electrode 102 on the alignment of the liquid crystal molecules, thereby achieving an effect of effectively inhibiting the crosstalk phenomenon without affecting transmittance. Besides, pattern design of the data line DL in the embodiment may also achieve the foregoing effect. Further, in a variant embodiment of this embodiment, the data line DL may not have a bent portion C and merely have a straight-line pattern.

Figure 11:
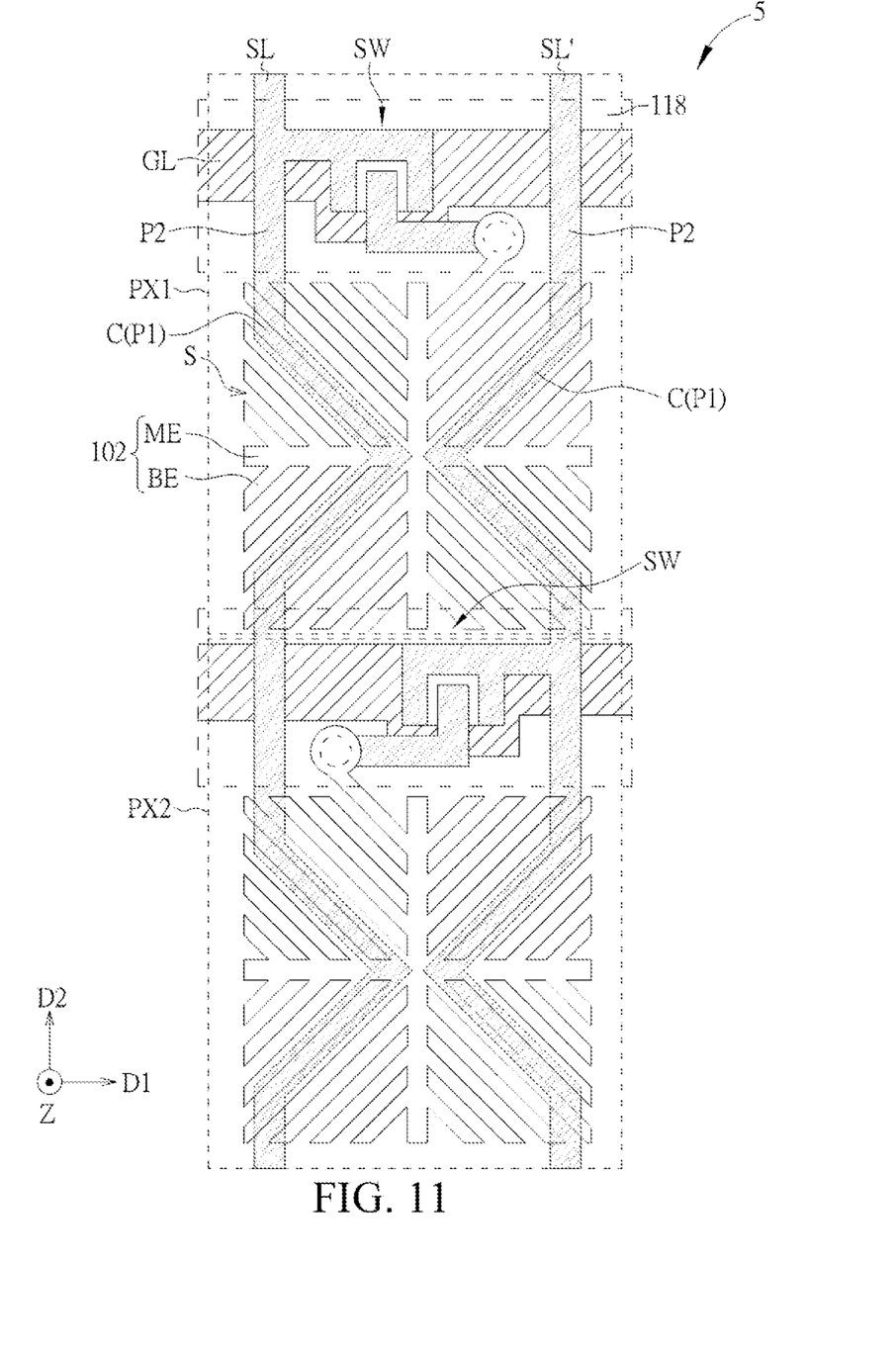
FIG. 11 is a partial schematic diagram of a pixel structure according to a fifth embodiment of the invention.

Referring to FIG. 11, FIG. 11 is a partial schematic diagram of a pixel structure according to a fifth embodiment of the invention. As shown in FIG. 11, this embodiment differs from the first embodiment in that: a pixel structure 5 includes another signal line SL' and a second pixel PX2 electrically connected to the signal line SL', in this embodiment, each of a first pixel PX1 and the second pixel PX2 merely has a unique pixel electrode 102, that is, the unique pixel electrode 102 is not divided by a gate line GL into a first sub-pixel electrode and a second sub-pixel electrode, but the present invention is not limited thereto. The signal line SL and the signal line SL' are adjacently disposed side by side in a first direction D1, and the first pixel PX1 and the second pixel PX2 are adjacently disposed side by side in a second direction D2. A switch device SW of the first pixel PX1 is electrically connected to the signal line SL, a switch device SW of the second pixel PX2 is electrically connected to the signal line SL', and the switch devices SW are disposed between the signal line SL and the signal line SL'. The signal line SL' includes at least one bent portion C that is disposed along directions of slits S of the pixel electrodes 102 of the first pixel PX1 and the second pixel PX2, branch electrodes BE of the pixel electrodes 102 of the first pixel PX1 and the second pixel PX2 cover edges of the bent portions C of the signal line SL and the signal line SL', where reference may be made to FIG. 3 for the covering manner, and the manner may be designed according to FIG. 4 to FIG. 6. Besides, in this embodiment, each switch device SW merely has one transistor that is electrically connected to the corresponding signal line SL or signal line SL', but the present invention is not limited thereto.

To sum up, in the pixel structure according to the present invention, a signal line extends through a region in which a pixel electrode is disposed, the signal line in the region has at least one bent portion extending along directions of slits of the pixel electrode, and the pixel electrode covers edges of the bent portion of the signal line. With this design, the pixel electrode covers an electric field at the edges of the signal line, thereby effectively inhibiting a crosstalk phenomenon. In addition, the signal line has the bent portion extending along the directions of the slits S of the pixel electrode, and therefore, the electric field of the signal line does not damage an effect of the pixel electrode on the alignment of liquid crystal molecules, thereby achieving an effect of effectively inhibiting the crosstalk phenomenon without affecting transmittance.

The foregoing descriptions are merely exemplary embodiments of the present invention, and variations and modifications made according to the claims of the present invention shall fall within the scope of the present invention.

What is claimed is:

1. A pixel structure, disposed on a substrate, the pixel structure comprising:
    a scan line, disposed on the substrate in a manner of extending along a first direction;
    a signal line, disposed on the substrate in a manner of extending along a second direction, the first direction and the second direction intersecting with each other; and
    a first pixel, wherein the first pixel comprises:
        a switch device, a gate of the switch device being electrically connected to the scan line; and a pixel electrode, electrically connected to the switch device, the pixel electrode comprising a plurality of slits, wherein the signal line comprises a first portion and a second portion, the first portion of the signal line overlaps the pixel electrode, the second portion of the signal line overlaps the scan line, the first portion of the signal line comprises at least one bent portion, the bent portion of the signal line is disposed along directions of the slits, and the pixel electrode covers edges of the bent portion of the signal line.

2. The pixel structure according to claim 1, wherein an angle is formed between each of extending directions of the slits and the first direction.

3. The pixel structure according to claim 1, wherein the pixel electrode comprises a plurality of branch electrodes, the slits are respectively located between adjacent branch electrodes, and some of the branch electrodes cover the edges of the bent portion and protrude from the edges of the bent portion.

4. The pixel structure according to claim 3, wherein the some of the branch electrodes covering the edges of the bent portion protrude from the edges of the bent portion by a width about ⅓ to 1 times a width of the bent portion.

5. The pixel structure according to claim 3, wherein widths of the some of the branch electrodes covering the edges of the bent portion are greater than widths of other branch electrodes that do not cover the edges of the bent portion.

6. The pixel structure according to claim 1, wherein the pixel electrode comprises a plurality of branch electrodes, the slits are respectively located between adjacent branch electrodes, one of the branch electrodes completely covers the bent portion and protrudes from edges at two sides of the bent portion, and a width of the branch electrode completely covering the bent portion is greater than widths of other branch electrodes that do not cover the bent portion.

7. The pixel electrode according to claim 1, wherein the pixel electrode comprises a first sub-pixel electrode and a second sub-pixel electrode, and the signal line comprises two bent portions that respectively overlap the first sub-pixel electrode and the second sub-pixel electrode.

8. The pixel structure according to claim 7, wherein the scan line is disposed between the first sub-pixel electrode and the second sub-pixel electrode, and the bent portions are electrically connected to each other through the second portion of the signal line.

9. The pixel structure according to claim 1, wherein the pixel electrode comprises a first sub-pixel electrode and a second sub-pixel electrode, a part of the signal line that overlaps the first sub-pixel electrode has the bent portion, and a part of the signal line that overlaps the second sub-pixel electrode is a straight-line portion.

10. The pixel structure according to claim 1, wherein the signal line further comprises a straight-line portion that overlaps the pixel electrode and is connected to the bent portion.

11. The pixel structure according to claim 1, wherein the signal line is electrically connected to a source of the switch device, and the pixel electrode is electrically connected to a drain of the switch device.

12. The pixel structure according to claim 1, further comprising a voltage division device, wherein the voltage division device is electrically connected to the signal line and the scan line.

13. The pixel structure according to claim 12, further comprising: a data line, disposed in a manner of extending along the second direction, and electrically connected to a source of the switch device.

14. The pixel electrode according to claim 12, further comprising a data line disposed in a manner of extending along the second direction, wherein the pixel electrode comprises a first sub-pixel electrode and a second sub-pixel electrode, the switch device comprises a first transistor and a second transistor, the first transistor and the second transistor are electrically connected to the data line, the first sub-pixel electrode is electrically connected to a drain of the first transistor, the second sub-pixel electrode is electrically connected to a drain of the second transistor, and the voltage division device is electrically connected to the drain of the second transistor.

15. The pixel structure according to claim 14, wherein the data line comprises a first portion and a second portion, the first portion of the data line overlaps the pixel electrode, the second portion of the data line overlaps the scan line, the first portion of the data line comprises at least one bent portion, the bent portion of the data line is disposed along directions of the slits, and the pixel electrode covers edges of the bent portion of the data line.

16. The pixel structure according to claim 1, further comprising another signal line and a second pixel electrically connected to the another signal line, the signal line and the another signal line being adjacently disposed side by side, and the switch device being disposed between the signal line and the another signal line, wherein the another signal line comprises at least one bent portion, the bent portion of the another signal line is disposed along directions of the slits of the pixel electrode of the first pixel, and the pixel electrode of the first pixel covers edges of the bent portion of the another signal line.

* * * * *